United States Patent [19]
Aoyama et al.

[11] Patent Number: 5,367,171
[45] Date of Patent: Nov. 22, 1994

[54] ELECTRON MICROSCOPE SPECIMEN HOLDER

[75] Inventors: Takashi Aoyama, Ibaraki; Kishu Hosoi, Hitachi; Yutaka Misawa, Katsuta; Koji Kimoto, Hitachi; Shigeto Isakozawa, Katsuta; Kazuhiro Ueda, Hitachi, all of Japan

[73] Assignee: Hitachi, Ltd., Tokyo, Japan

[21] Appl. No.: 965,423

[22] Filed: Oct. 23, 1992

[30] Foreign Application Priority Data

Oct. 24, 1991 [JP] Japan .................. 3-277450
Jun. 18, 1992 [JP] Japan .................. 4-159133

[51] Int. Cl.5 .................................. H01J 37/20
[52] U.S. Cl. ...................... 250/443.1; 250/442.11
[58] Field of Search ............ 250/443.11, 442.11, 250/440.11, 311

[56] References Cited

U.S. PATENT DOCUMENTS

| 3,896,314 | 7/1975 | Nukui et al. | 250/443.11 |
| 4,591,722 | 5/1986 | Biddlecombe et al. | 250/443.11 |
| 4,703,181 | 10/1987 | Swann et al. | 250/442.11 |
| 4,797,261 | 1/1989 | Swann et al. | 250/442.11 |
| 4,950,901 | 8/1990 | Jones et al. | 250/443.11 |
| 4,996,433 | 2/1991 | Jones et al. | 250/443.11 |
| 5,091,165 | 2/1992 | Hokke | 250/443.11 |

FOREIGN PATENT DOCUMENTS

| 0427326 | 2/1990 | European Pat. Off. . |
| 2126625 | 5/1971 | Germany . |
| 63-193447 | 8/1988 | Japan | 250/443.1 |

OTHER PUBLICATIONS

8056 Journal of Physics E. Scientific Instruments vol. L5 (1982) Feb. No. 2, Dorking, Great Britian.

Primary Examiner—Bruce C. Anderson
Attorney, Agent, or Firm—Antonelli, Terry, Stout & Kraus

[57] ABSTRACT

A specimen cartridge fashioned of a good thermal conductor, with an outer frame being fashioned of heat insulating material, and with a connecting rod being fashioned of a poor thermal conductor. A temperature distribution of the specimen is uniform and a temperature drift is reduced, with a thermal expansion of a specimen cartridge tilting rod not affecting the tilting angle, thereby making it possible to perform various highly accurate observations and measurements with an electron microscope.

19 Claims, 6 Drawing Sheets

ELECTRON MICROSCOPE SPECIMEN HOLDER

BACKGROUND OF THE INVENTION

Field of the Invention

The present invention relates to an electron microscope specimen holder and, more particularly, to an electron microscope specimen holder which enables the specimen position to be stable even if heated and cooled.

When observing a specimen and performing various measurements (e.g., elemental analysis using characteristic X-rays) with an electron microscope, in order to prevent contamination of the specimen or induce the phase change, generally the specimen is observed and measured in a heated or cooled state.

As the temperature is elevated or lowered, the specimen position is changed due to thermal expansion or contraction of the holder, and accurate observation and measurement will be difficult. To cope with this, there a number of specimen or sample holders have been proposed.

In a first type of specimen holder disclosed, for example, in U.S. Pat. Nos. 3,896,314 and 4,703,181 the holder is constructed of plural materials whose thermal expansion coefficients are different from each other and they expand (shrink) in opposite directions so that a net shift of specimen (sample) position caused by thermal expansion is cancelled.

In a second type disclosed, for example, in Japanese Patent Unexamined Publication No. 1,197,952 (A), the temperature change of the specimen holder is detected by a sensor and a specimen support is moved in an amount corresponding to the thermal expansion so as to maintain the specimen position unchanged, thereby enabling accurate observation or measurement.

The first type conventional approach is based on an assumption that a uniform temperature distribution can be obtained over a wide area. In real sample (specimen) holders, however, thermal conduction of various materials is important and there exist temperature profiles which change in various forms, resulting in an error of the specimen position.

In the second type conventional approach, the actual position change of the specimen is not detected, and it is not easy to maintain the specimen position unchanged.

Further, in any case, no consideration has been given to the accurate rotation about a tilt axis or axes of the specimen, particularly the tilt axis perpendicular to the axis of the specimen holder.

As described above, the prior art involve the problem that it is difficult to maintain the specimen position unchanged, in the heating specimen holder accompanied with parallel movement and rotary driving.

SUMMARY OF THE INVENTION

Object of the Invention

An object of the present invention is to make it possible to control the specimen position with high accuracy particularly in a heating specimen holder thereby enabling a highly accurate observation and measurement with an electron microscope.

An electron microscope specimen holder according to the present invention has a specimen support such as a specimen cartridge within an outer frame and the specimen support has larger thermal conductivity than that of material of the outer frame.

Particularly, it is preferred that the coefficient of thermal expansion of the material for the outer frame is in the range of $5.0 \times 10^{-7} \sim 1.2 \times 10^{-5}$/K. Further, it is preferred that the specimen support is made of titanium or stainless steel and the outer frame is made of sialon, cordierite or titanium.

Further, an electron microscope specimen holder according to the present invention comprises an outer frame, a specimen support such as a specimen cartridge within the outer frame and tilting pivots serving to incline or tilt the specimen support, wherein a thermal conductivity of material of the specimen stage is greater than that of material of the outer frame and a coefficient of thermal expansion of material of the tilting pivots is in the range of $5.0 \times 10^{-7} \sim 1.2 \times 10^{-5}$/K.

Moreover, an electron microscope specimen holder according to the present invention is of the type that a specimen set on a specimen support such as a specimen cartridge is moved in a plane and rotatably driven and a rod, serving to control an angle of the specimen support, is in contact with the specimen support on a torsion or twistedly warped surface.

In addition, an electron microscope specimen holder according to the present invention comprises a specimen support such as a specimen cartridge, a rod serving to control an angle of the specimen support and a pressure spring, wherein the specimen support has a double-layer structure including a platform on which a specimen is to be placed and a heater, and the rod and the pressure spring serve as power supply lines for the heater as well. In this way, by omitting specific power supply lines, it is possible to control the tilt angle with high accuracy.

Particularly, it is preferred that the specimen support is of a stacked structure including a metal portion and a ceramic heater.

Further, an electron microscope specimen holder according to a further aspect of the present invention has a coupling or joint structure including a high temperature part and a low temperature part, wherein the high temperature part is made of heat insulating material and the low temperature part is made of low thermal expansion material.

Moreover, an electron microscope specimen holder according to a further aspect of the present invention comprises a specimen support such as a specimen cartridge, wherein a thermal conductivity of material of an inner part of the specimen support is greater than that of material of an outer part thereof.

In addition, an electron microscope specimen holder according to a further aspect of the present invention is of the type that a specimen support such as a specimen cartridge is disposed within an outer frame and is heated in use, wherein a temperature gradient between the specimen support and the outer frame is steep when the specimen holder is in use.

Furthermore, an electron microscope specimen holder according to a further aspect of the present invention is of a type that a position of a specimen is changed, wherein an amount of change of the specimen position is in the range of $0.02 \sim 0.10$ nm/sec.

Additionally, according to another aspect of the present invention, there is provided an electron microscope in which one of the above-mentioned electron microscope specimen holders is mounted.

Further, an electron microscope specimen holder according to the present invention is adapted for use in observing a state of a specimen placed on a specimen support such as a specimen cartridge by applying an electron beam to the specimen and comprises a heater at a bottom of the specimen support for heating the specimen on the specimen support up to a predetermined temperature, a rod for controlling an angle of the specimen support and a pressure spring for supporting the specimen support, wherein the rod has a shape that makes a contact surface between the rod and the specimen support stationary in the vertical direction and electric power is supplied to the heater through the rod and the pressure spring.

In addition, an electron microscope according to the present invention is of a transmission type which comprises an electron gun for producing an electron beam, an optical system applying the electron beam to a predetermined range at a fixed amount, a specimen or sample holder on which a specimen is to be placed so as to be observed as being applied with the electron beam, another optical system for observing a state of the specimen on the specimen holder and an operation control system, wherein the specimen holder has a structure that a specimen support such as a specimen cartridge is disposed within an outer frame, a thermal conductivity of material of the specimen support is greater than that of material of the frame, and the specimen support is provided at a lower part thereof with a heater to which electric power is supplied through a pressure spring serving to hold the specimen stage and through a rod serving to adjust a tilting or inclination of the specimen holder.

Further, an electron microscope heating specimen holder according to the present invention comprises a specimen holder and a bearing or connecting rod, wherein a thermal conductivity of material of the rod is smaller than that of material of a main body of the specimen holder.

Particularly, it is preferred that the thermal conductivity of the rod is in the range of 15~20 W/mK.

In addition, an electron microscope heating specimen holder device according to the invention comprises a specimen holder for holding a specimen and a bearing or connecting rod serving to finely control a position of the specimen, wherein the specimen holder is made of phosphor bronze and the rod is made of SUS304.

Further, an electron microscope heating specimen holder according to the invention is of a type that a heater, for heating a specimen, is disposed at a bottom of a specimen stage support such as a specimen cartridge for supporting the specimen, wherein the heater is a plate heater made by forming a film of high resistance metal on a plate-like insulating member by vapor deposition or sintering.

Still further, an electron microscope heating specimen holder according to the present invention comprises a heater formed on an insulating member or members and serving to heat a specimen, wherein the heater is a plate heater made by filling a groove formed in a plate-like insulating member with high resistance metal or by sandwiching high resistance metal between the plate-like insulating members.

In addition, an electron microscope heating specimen holder according to a further aspect of the present invention has a structure such that a thermocouple is in contact with a specimen support such as a specimen cartridge, wherein the thermocouple is disposed at a tip end of an elastic lead portion.

According to the present invention, there is provided an electron microscope in which one of the above-mentioned electron microscope specimen holders is mounted.

In the electron microscope specimen holder, it is necessary to control the specimen position with high accuracy. Further, it is also necessary to move or displace the specimen in performing various measurements and observations. The electron microscope specimen holder of the present invention can perform even such movements with high accuracy. Planar movement is made within the X-Y plane while rotary movement is made about X and Y axes with the angle controlled within a range of about ±15°. Namely, the electron microscope specimen holder of the invention is typically a double tilt heating specimen holder in which the specimen can be rotationally displaced about two axes.

The present invention is also directed to a transmission electron microscope which comprises an electron gun of field emission type and is applicable to one in which the electron beam can be converged or focused down to a range of 1 nm in diameter. This type of electron microscope is capable of performing various analyses of a very small range and, particularly according to the present invention, the amount of drift of the specimen position can be reduced to not more than 0.1 nm. The present invention can solve the problem of the prior art and meet a demand of control with high accuracy.

In other words, in accordance with the present invention, the specimen support, such as a specimen cartridge, of the specimen holder is made of good thermal conductor and the outer frame of the specimen support is made of heat insulator. Further, the specimen support and the specimen support tilting rod are brought into contact with each other on a warped surface. Additionally, the specimen support tilting rod serves as the heating power supply line as well.

In the present invention, the specimen holder main body is fashioned of a good thermal conductor and the bearing or connecting rod which serves to support the specimen holder from the side of TEM and move the specimen holder slightly is fashioned of such material that has a lower thermal conductivity than the material for the specimen holder. Furthermore, in order to measure the specimen temperature, there is provided the thermocouple in contact with the specimen support under elastic force.

According to the present invention, since the specimen support portion is made of good thermal conductor, the temperature distribution is uniform. Furthermore, since the outer frame portion is made of heat insulating material, the temperature rise thereof is suppressed as compared with that of the specimen support portion. Consequently, even if there is a temperature drift in the specimen support portion, a magnitude of the temperature drift in the outer frame (holder portion) is very small. For this reason, the horizontal position of the specimen portion and the angle of inclination or tilting of the specimen support are only slightly affected, thereby making it possible to perform accurate observation and measurement with the electron microscope.

Furthermore, by making the specimen support and the specimen support tilting rod come in contact with a warped surface, the contact surface can be kept in parallel at all times with the direction in which the length of the rod is changed due to thermal expansion. For this reason, even if the length of the rod is changed due to thermal expansion, the angle of inclination or tilting can be maintained constant at all times.

Moreover, since power is supplied to the tilting specimen support heater through the rod and the pressure spring, the tilting specimen support (cartridge) and the outer frame can be brought into contact with each other only through the rod, spring and sapphire pivot. For this reason, conduction of heat from the specimen support to the outer frame can be minimized, thereby making it possible to minimize the thermal drift of the outer frame. Additionally, when the specimen holder is fashioned of good thermal conductor and the bearing or connecting rod of a fine adjustment device is fashioned of such material that has a thermal conductivity lower than that of the material for the specimen holder, with the specimen holder being supported by the TEM main body by the connecting rod and, hence, thermal expansion of the connecting rod directly results in change of the specimen position.

On the other hand, thermal expansion of the specimen holder has substantially no effect on the change of the specimen position since the specimen holder can be moved in the lateral or transverse direction. The time required for all of the specimen holder and the connecting rod to reach the thermal equilibrium depends upon the thermal conductivity of the specimen holder. After reaching the thermal equilibrium, the amount of drift of the specimen position depends on a slight change in the temperature of the connecting rod.

When the specimen holder is fashioned of highly thermally conductive material, the specimen holder reaches the thermal equilibrium state in a short time. Therefore, the temperature of the connecting rod reaches the thermal equilibrium state in a short time as well.

When the connecting rod is made of poor thermal conductor the temperature gradient becomes steep from the contact portion with the specimen holder so that the temperature of the bearing rod is decreased as a whole. Accordingly, the absolute value of temperature change is reduced, thereby making it possible to reduce the drift of the position.

With regard to the heating power supply and the temperature measurement, it has been customary to supply power by connecting lead wires directly to the specimen support and to measure the thermoelectromotive force of the thermocouple, however, in accordance with the present invention, since there is no possibility that the lead wires stands in the way, it becomes possible to incline or tilt the specimen support with high accuracy. Furthermore, in the specimen holder which has the lead wires, breaking of wire is caused due to fatigue of metal resulting from repeated tilting. In the present invention, however, the lifetime of the specimen holder is extended, thereby solving the conventionally pending problem of short lifetime of the specimen holder.

DETAILED DESCRIPTION OF THE PREFERRED EMBODIMENTS

The foregoing and other objects, features and advantages of the invention will be made clearer from description given below of embodiments of the present invention with reference to the drawings.

Figure 1:
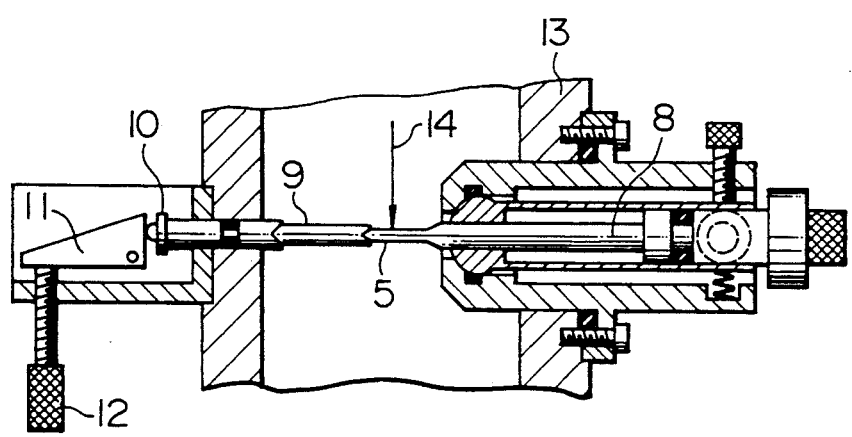
FIG. 1 is a cross-sectional view of a specimen drive portion of an electron microscope to which a specimen holder according to the present invention is attached.

As shown in FIG. 1, the specimen holder 8 is inserted in a column 13 of the electron microscope, with the specimen holder 8 abutting a fine adjustment device through a connection or bearing rod 9 and comes to a halt. The fine adjustment device comprises a fine movement shaft 10, a lever or bell crank 11, and a screw rod 12. The system is shown in FIG. 1 in which an electron beam is passed along an electron beam path 14 through an outer frame 5 of a specimen support or cartridge portion of the specimen holder 8 so as to observe or measure the specimen with respect to its form or the like.

Figure 2:
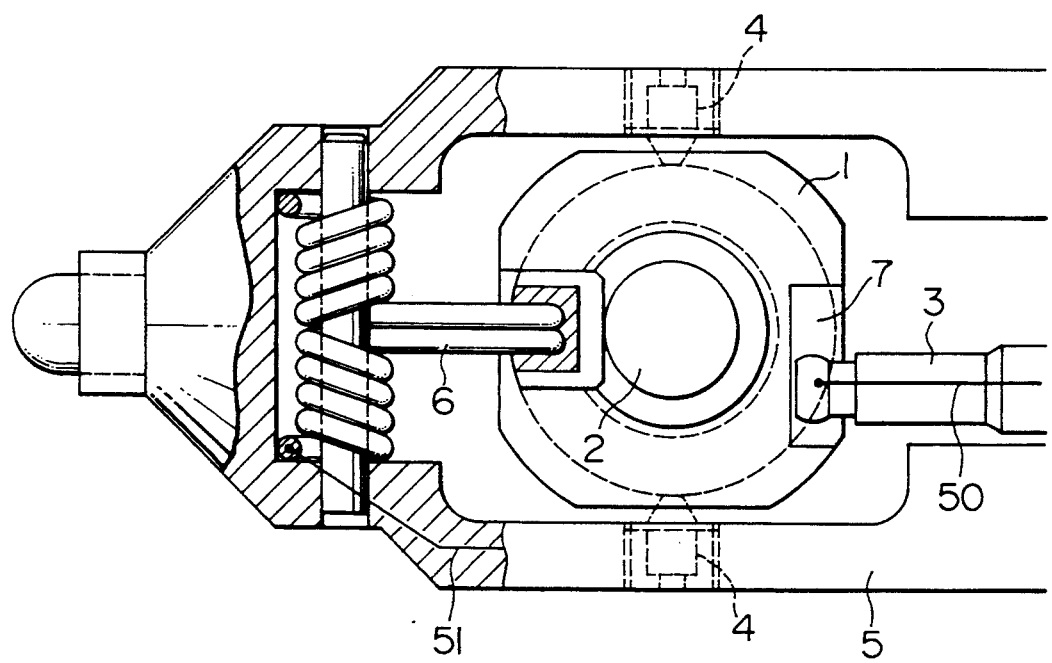
FIG. 2 is a plan view of a specimen support or cartridge portion of FIG. 1.

As shown in FIG. 2, a specimen cartridge 1 forming a specimen support has a specimen 2 disposed thereon, with a rod 3 adjusting inclination of tilting of the specimen cartridge 1. Pivots 4 support the specimen cartridge 1 through an outer frame 5, with a pressure spring 6 preventing the specimen cartridge from moving in the vertical direction, and with a contact surface 7 being provided between the specimen cartridge 1 and the rod 3.

The specimen cartridge 1 is fashioned of silicon carbide (SiC). Since the silicon specimen cartridge 1 has a large thermal conductivity (62.9 W/mK), the temperature distribution of the specimen 2 becomes uniform.

On the other hand, the frame portion 5 is made of a cordierite having a small thermal conductivity of about 1/30 (1, 7 W/mK) as compared with the silicon carbide, so that conduction of heat from the specimen cartridge 1 to the outer frame 5 is low. As a result, when heating the specimen 2 up to 200° C., the temperature drift of the specimen 2 is about ±1° C.; however, since the rise of the temperature of the outer frame 5 itself is limited to about 110° C., the temperature drift thereof is controlled or suppressed to be less than about ±0.02° C. Therefore, a change in the horizontal position caused by thermal expansion is almost negligible.

Figure 3A:
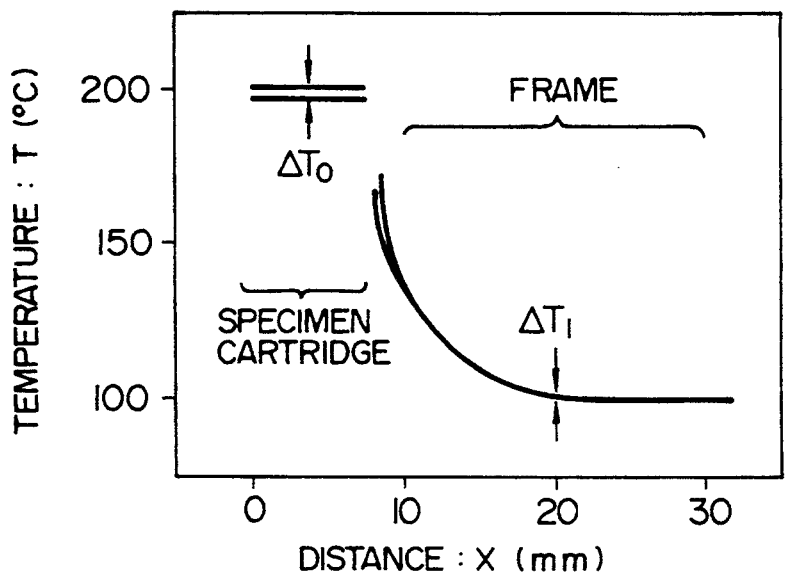
FIGS. 3A and 3B are graphical illustrations of a temperature distribution of the specimen holder.
Figure 3B:
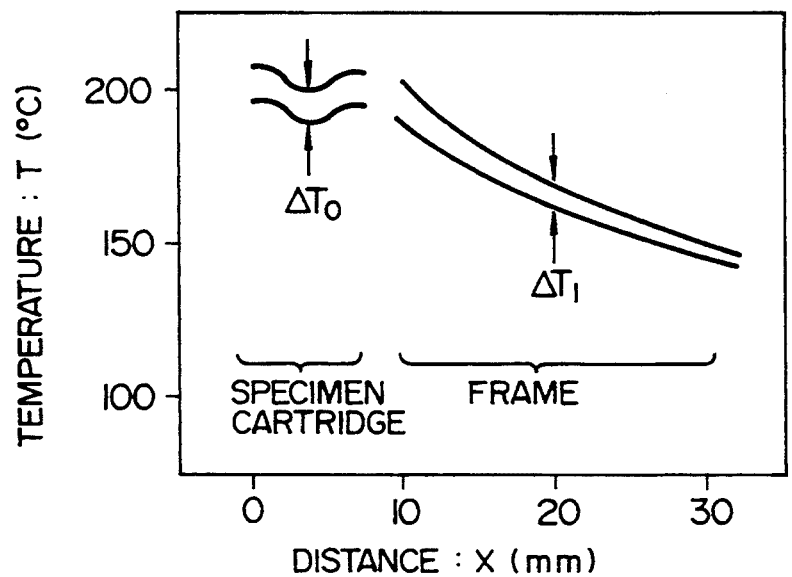

FIG. 3B shows a temperature distribution of a conventional specimen holder obtained when the specimen cartridge 1 and the frame 5 were made of the same material (alumina).

Since the thermal conductivity is not large in the part of the specimen cartridge 1, the temperature distribution of the specimen cartridge is non-uniform. Alumina has too large a thermal conductivity for the frame 5 so that the entire frame 5 is heated to high temperature, resulting in a temperature drift of a magnitude substantially the same as the specimen portion. This temperature drift effected upon the horizontal position of the specimen portion and the angle of inclination or tilting of the specimen cartridge 1 make it difficult to carry out precise observation and measurement with the electron microscope.

Since the part of the specimen cartridge i is made of good thermal conductor (silicon carbide SiC or titanium), the temperature distribution thereof, as shown in FIG. 3A, is uniform. The part of the frame 5 is made of heat insulating material (cordierite or sialon) so that temperature rise thereof is suppressed as compared with the part of the specimen cartridge 1. Therefore, even if a temperature drift takes place in the part of the specimen cartridge 1, the temperature drift of the frame (holder portion) is very small. Consequently, the horizontal position of the specimen portion and the angle of inclination or tilting of the specimen cartridge are affected very little, thereby having made it possible to make precise observation and measurement with the electron microscope. Table 1 shows the heat conductivities of conventional specimen holders according and examples of the present invention.

TABLE 1

| | | Specimen Cartridge | Frame |
|---|---|---|---|
| Conventional Art | Material Thermal Conductivity (W/mK) | Alumina (Al$_2$O$_3$) 16.8 | |
| Example 1 | Material Thermal Conductivity (W/mK) | Silicon Carbide (SiC) 62.9 | Cordierite 1.7 |
| Example 2 | Material Thermal Conductivity (W/mK) | Titanium (Ti) 22 | Sialon 10.1 |

Figure 4:
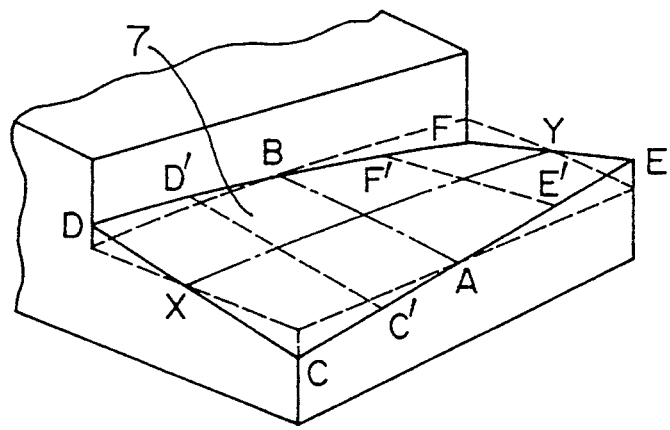
FIG. 4 is a perspective view of the specimen cartridge portion of FIG. 2.
Figure 5A:
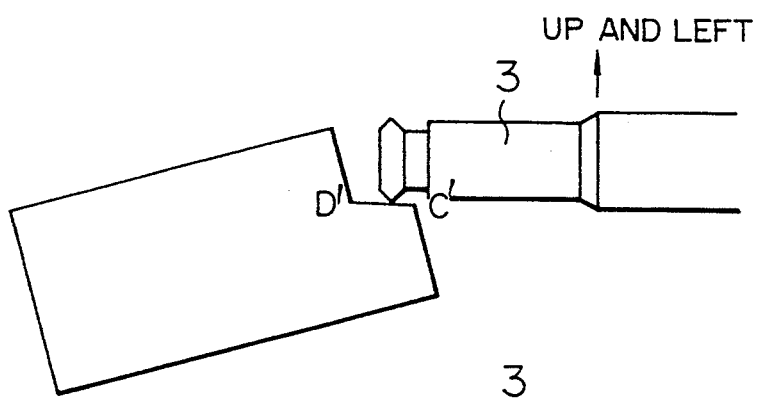
FIGS. 5A-5C are schematic views of the positions of the specimen cartridge portion of FIG. 2.

In FIG. 4, lines A-B and X-Y orthogonally intersect each other on a horizontal plane; and however, points D and E are raised relative to the horizontal plane while points C and F are lowered relative to the horizontal plane. A surface CEFD is a warped surface (of saddle type) as a whole. When the rod 3 is driven in the vertical direction up or down to cause the tilting of the specimen cartridge 1 to rotate or tilt about the tilting pivots 4 in FIG. 2, the rod 3 is simultaneously moved left or right on this warped surface 7 simultaneously. When the specimen cartridge 1 is held flat FIG. 5B, the rod 3 contacts on the length of the line A-B so that, even if the rod 3 is changed due to thermal expansion, the angle of inclination or tilting of the specimen cartridge 1 is not changed because the direction of the rod 3 is parallel to the contact surface A-B in FIG. 5B. FIGS. 5A and 5C illustrate the cases wherein the rod 3 is moved up and left or down and right. When the rod 3 is moved up and left as shown in FIG. 5A, the rod 3 contacts on the line C'-D', wherein, when the rod 3 is moved down and right, as shown in FIG. 5C the rod 3 contacts on the line E'-F'. The line C'-D' is between A-B and C-D, and the line E'-F' is between A-B and E-F.

Figure 5B:
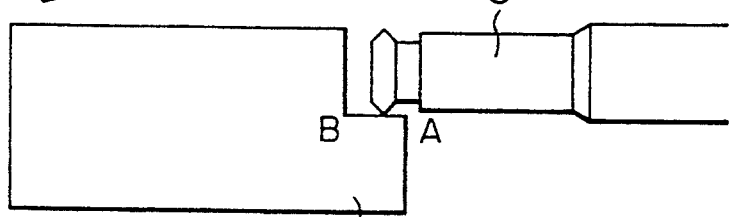
Figure 5C:
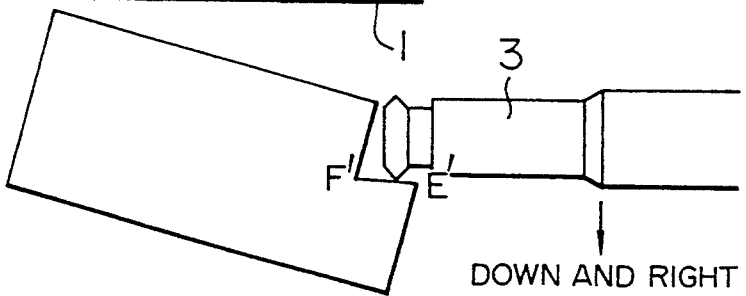

If the contact surface were flat in all areas, an change in length of the rod 3 caused by thermal expansion would result in change the angle of or tilting except when the specimen cartridge 1 is flat as shown in FIG. 5B. According to the present invention, however, since the contact surface is the warped surface, the contact line C'-D' or E'-F' is always maintained parallel to the rod 3. Therefore, even if the rod length is changed due to thermal expansion, the tilting angle can be kept unchanged for all tilting angles.

In this manner, by moving the rod 3 up and left or down and right, it is possible to tilt the specimen cartridge 1 upwards or downwards accurately within ±15°. The lines C-D and E-F are inclined downwards and upwards by ±15° to the line A-B.

As shown in FIG. 2, a lead wire 50 is extended to the tip end portion of the rod 3. Alternatively, the rod portion 3 may be made of electrically conductive material while coating an outer surface thereof with insulating material except the tip end portion which is brought into contact with the specimen cartridge 1 for passing current to the specimen cartridge and another lead wire 51 is extended to one end of the spring 6. As a further alternative, may be, extended to the end portion of the spring 6 but to a spring support member for passing current so that power is supplied to a heater provided in the specimen cartridge 1.

The manner of wiring the leads is not limited to the above described and it is also possible to connect the leads directly to the rod 3 and the spring 6 from the outside of the frame 5.

Figure 6:
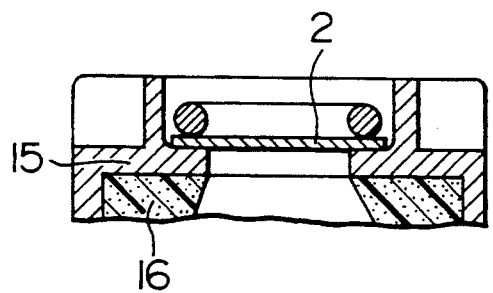
FIG. 6 is a cross-sectional view of the specimen holder according to the invention in which a heater is employed.

The applied voltage for the heater is 2.0 mV and the current is 1.15 A. Temperature control is performed by the voltage-time control method. Since the specimen cartridge 1 is maintained in contact with the frame 5 only by the rod 3, spring 6 and sapphire pivots 4, heat conduction therebetween can be minimized. As shown in FIG. 6, the specimen cartridge has a stacked structure including a metal plate 15 and a ceramic heater 16 whereby it is possible to provide a uniform temperature distribution. As the ceramic heater 16, a plate heater was used.

Figure 7:
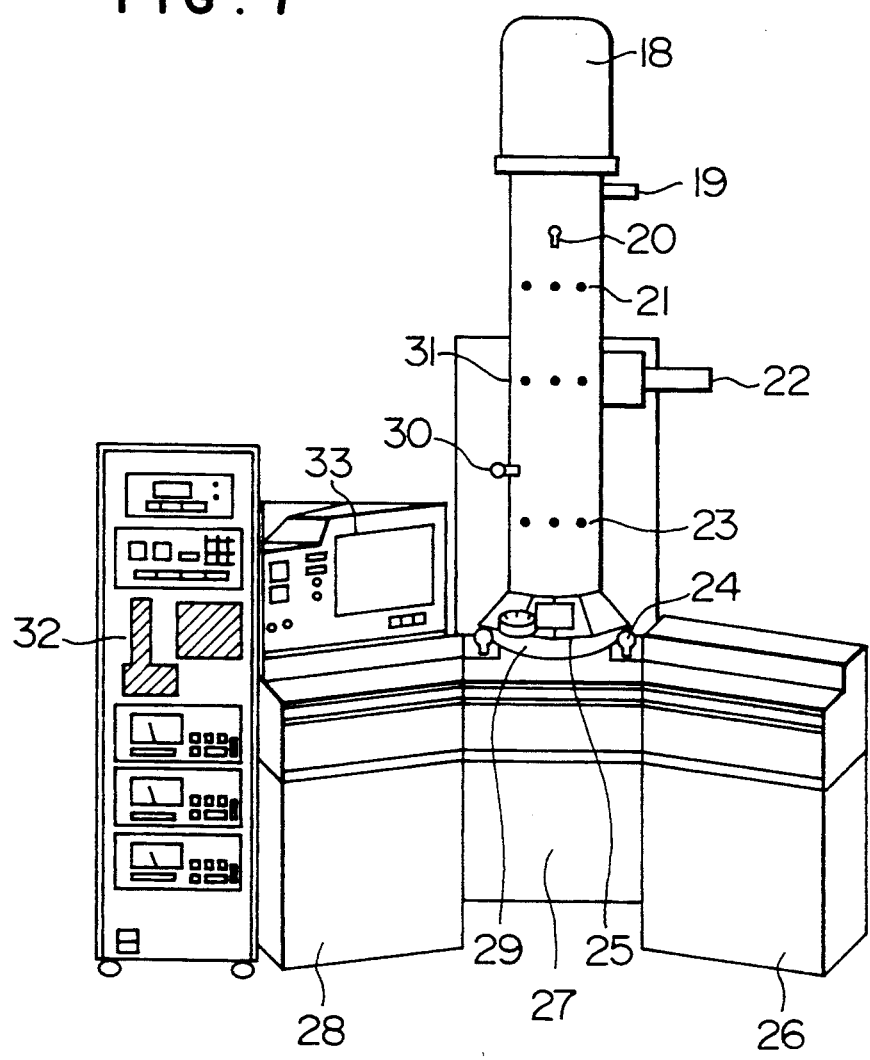
FIG. 7 is a general perspective view of a transmission electronic microscope (TEM) in which a double tilt heating specimen holder of the invention is employed.

As shown in FIG. 7, above a sample or specimen holder unit 22 are arranged an electron gun 18 serving to produce an electron beam, a gun valve 19, a condensor lens unit 21 and a condensor less aperture means 20, while below the specimen holder unit 22 are arranged an objective less unit 31, a selected area aperture means 30, an image forming lens unit 23, a viewing chamber 29, a camera chamber 27 and the like. Besides, it is possible to observe the state of specimen by a magnifier 25 and a monitoring device 33, to adjust the specimen observing position by operating a specimen moving knob 24, and to adjust the specimen position or to take a picture by control panels 26, 28 provided right and left or a controller 32.

With this TEM, observation of a specimen was made actually by making use of the double tilt specimen holder according to the present invention. The specimen used was made of polycrystalline silicon which was thinned by an ion milling. After the specimen was inserted in the electron microscope, supply of the current to the specimen cartridge heater was increased gradually until the specimen was heated up to 200° C. Acceleration voltage of electrons was 200 kV and observation was made with a magnification ratio of 100,000 to 1,000,000. By rotating the screw rod 12 shown in FIG. 1, the fine movement shaft 10 was moved to decide the observing position in one direction (X axis) on the horizontal plane. The observing position in the other direction (Y axis) on the horizontal plane was decided in the same manner as that in the X-axis direction by rotating another screw rod (not shown) provided in the vicinity of the specimen holder of FIG. 1. In case of the polycrystalline silicon, lattice image thereof appear clearly at various angles of inclination or tilting. When the specimen was heated to 200° C. and the electron beam was converged to have a diameter of 2 nm, characteristic X-rays from various zones were analyzed. As a result, it was observed that phosphorus (P), atoms of impurity, segregated at grain boundaries.

Furthermore, referring to FIG. 1, as the specimen holder 8 is inserted in the column of the electron microscope, it abuts against the connecting or bearing rod 9 of the fine adjustment device and comes to a halt. The fine adjustment device comprises the fine movement shaft 10, the lever the such as bell crank 11, the screw rod 12, the connecting rod 9 and the like. An example of the specimen holder 8 was made of phosphor bronze. The phosphor bronze has a large thermal conductivity (62.9 W/mK) so that the temperature distribution of the specimen becomes uniform.

On the other hand, the connecting rod 9 is made of SUS304 the thermal conductivity of which is small (15.1 W/mK).

As a result, according to the example, the present invention, even in case of heating the specimen up to 200° C., the drift of the specimen was reduced to less than ±0.1 nm/sec three hours after in contrast to the conventional arts. Summarizing the results described above, Table 2 shows the embodiments of the invention as compared with conventional constructions.

TABLE 2

|  |  | Connecting Rod | Specimen Holder |
| --- | --- | --- | --- |
| Conventional Art (1) | Material Thermal Conductivity (W/mK) | Cordierite 1.7 | |
| Conventional Art (2) | Material Thermal Conductivity (W/mk) | Phosphor Bronze 60 | |
| Example 3 | Material Thermal Conductivity (W/mK) | SUS304 15.1 | Phosphor Bronze 60 |
| Example 4 | Material Thermal Conductivity (W/mK) | Sialon 10.1 | Titanium 22 |

Figure 8:
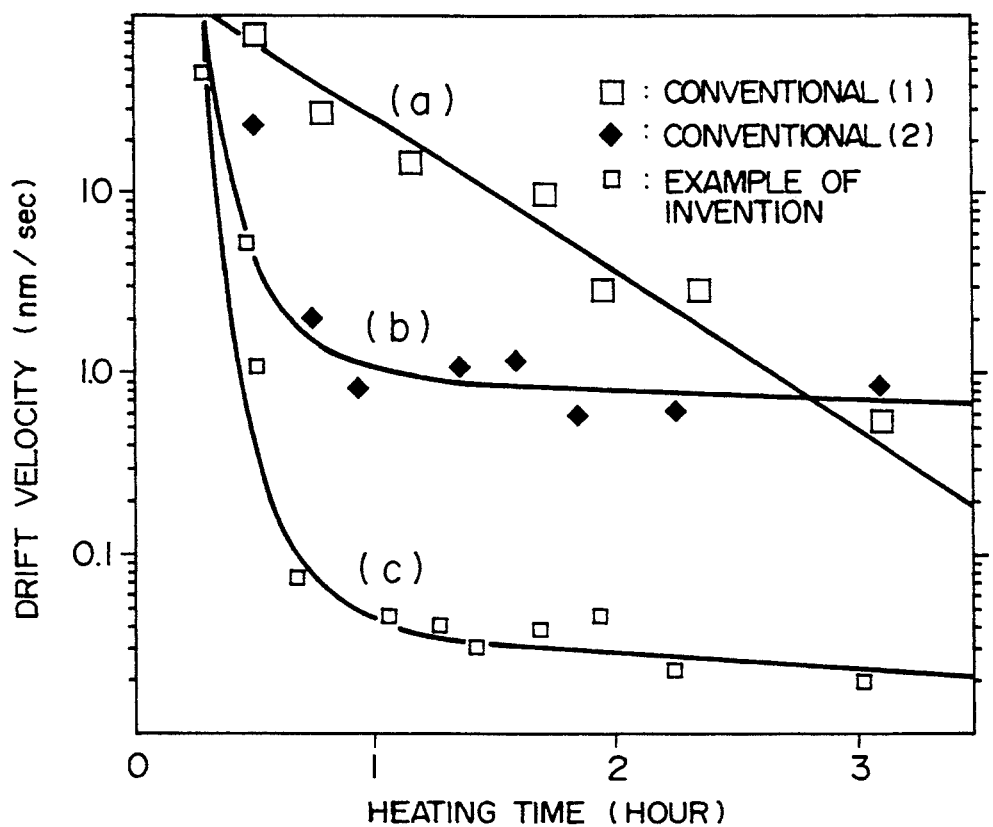
FIG. 8 is a graphical illustration of a relationship between the change of the amount of drift with respect to the lapse of time.

FIG. 8 shows the changes of the amount of drift with the lapse of time according to conventional constructions and the present invention. In FIG. 8, a straight line (a) represents the conventional art (1) in which since the specimen holder is made of poor thermal conductor the specimen holder does not reach the thermal equilibrium within observation. In FIG. 8, a curve (b) represents the conventional art (2) in which since the holder is made of highly thermally conductive material the thermal equilibrium can be reached in a short time, and however, since the connection rod is also made of highly thermally conductive material, the temperature becomes high to increase the drift. In FIG. 8, a curve (c) represents the example of the invention in which, since the specimen holder is made of highly thermally conductive material and the convecting rod is made material of much lower thermal conductivity the thermal equilibrium can be reached in a short time and the drift is small after reaching the equilibrium.

As a result of the experiment using the examples of the present invention, the specimen drift became ±0.1 nm/sec an hour and a half after.

Figure 10:
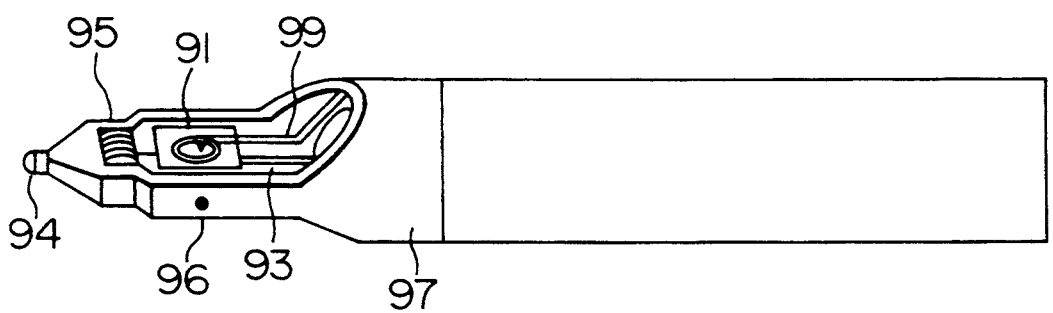
FIG. 10 is a perspective view of the structure for measuring the temperature of the specimen according to the invention.
Figure 9A:
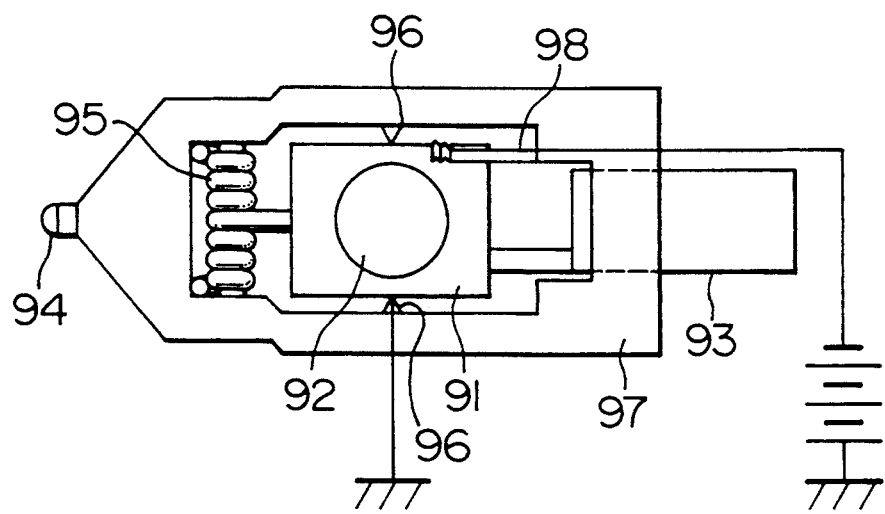
FIGS. 9A and 9B are plan schematic view of two types of power supply mechanisms according to the present invention for the heating portion.
Figure 9B:
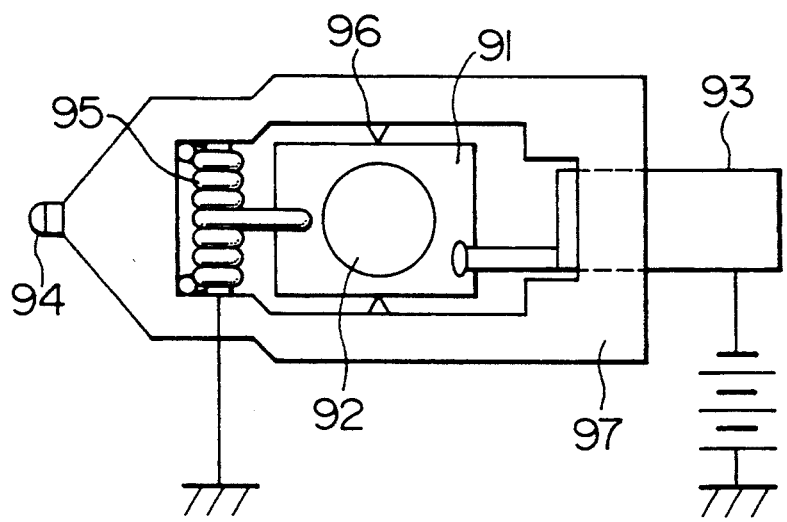

Now, the power supply line for the tilting specimen cartridge heater according to embodiments of the present invention will be described by referring to FIGS. 9A–9B. A first structure is that the power is supplied through a lead portion 98 coming in contact due to elastic force and a tilting pivot 96. The electric current flows from the lead portion 98 to the heater of a specimen support 91 such as a specimen cartridge and then flows out to the outside through the tilting pivot 96 (FIG. 9A). A second structure is that the power is supplied through a rod 93 and a spring 95. The electric current flows in from the rod 93 to the heater of the specimen cartridge 91 and then flows out to the outside through the spring 95 (FIG. 9B). The applied voltage for the heater is 2.0 V and the current is 0.25 A. Temperature control is performed in accordance with the current-time control method. In such structure, it is possible to measure the temperature of the specimen cartridge by attaching a thermocouple 99 to the tip end of the conductive spring as shown in FIG. 10. The specimen cartridge can be formed to have a stacked structure including a metal plate and a thin film heater, and a uniform temperature distribution can be actualized.

Further, in the structure of FIG. 9A, the specimen cartridge is of a triple-layer structure including metal, ceramic heater and metal.

In FIGS. 9A, 9B and 10, reference numeral 92 denotes a specimen, 94 denotes a pivot and 97 denotes an outer frame.

Lastly, description will be given results of actual observation and measurement using the electron microscope according to the embodiment of the invention. The specimen of SUS316L which is a material for nuclear facilities was thinned by a TEM pole. After the specimen was inserted in the electron microscope, supply of the current to the specimen cartridge heater was increased gradually until the specimen was heated up to 200° C. Acceleration voltage of electrons was 200 kV and observation was made with a magnification ratio of 100,000 to 1,000,000. By rotating the screw rod, the fine movement shaft was moved to determine the observing position in one direction (X axis) on the horizontal plane. The observing position in the other direction (Y axis) on the horizontal plane was decided in the same manner by rotating another screw rod provided in the vicinity of the specimen holder. In this manner, the lattice image was photographed.

As another embodiment, there was prepared a specimen holder of coupling structure in which the high temperature part of the specimen holder was fashioned of heat insulating material and the low temperature part thereof was fashioned of low thermal expansion material. This was useful in suppressing the rise of the temperature of the specimen holder to be less than the specimen temperature.

According to the present invention, particularly in the heating specimen holder for the electron microscope, it becomes possible to control the specimen position and the tilting angle with high accuracy, and the amount of drift of the specimen position can be controlled less than 0.1 nm/sec., thereby enabling highly accurate observation and measurement with the electron microscope.

What is claimed is:

1. An electron microscope specimen holder having a specimen support within an outer frame, wherein a thermal conductivity of material of said specimen support is greater than that of material of said outer frame and wherein the specimen support includes a heater.

2. An electron microscope specimen holder having a specimen support within an outer frame, wherein a thermal conductivity of material of said specimen support is greater than that of material of said outer frame, and wherein a coefficient of thermal expansion of the material of said outer frame is in a range of $5.0 \times 10^{-7} \sim 1.2 \times 10^{-5}$/K.

3. An electron microscope specimen holder having a specimen support within an outer frame, wherein a thermal conductivity of material of said specimen support is greater than that of material of said outer frame, and wherein said specimen support is made of the material selected from a group essentially consisting of titanium and stainless steel, and said outer frame is fashioned of a material selected from a group essentially consisting of sialon and cordierite.

4. An electron microscope specimen holder having a specimen support within an outer frame, wherein a thermal conductivity of material of said specimen support is greater than that of material of said outer frame, and wherein said specimen support includes a stacked structure comprising a metal portion and a ceramic heater.

5. An electron microscope specimen holder comprising:
an outer frame;
a specimen support within said frame; and
tilting pivots for inclining said specimen support relative to said frame,
wherein a thermal conductivity of material of said specimen support is greater than a thermal conductivity of material of said frame and a coefficient of thermal expansion of material for said tilting pivots is in a range of $5.0 \times 10^{-7} \sim 1.2 \times 10^{-5}$/K.

6. An electron microscope specimen holder in which a specimen set on a specimen support is moved in a plane and is rotatably drive, wherein a rod for controlling an angle of said specimen support is in contact with said specimen support on a warped surface.

7. An electron microscope specimen holder comprising:
a specimen support;
a rod for controlling an angle of said specimen support; and
a pressure spring,
wherein said specimen support comprises a double-layer structure including a platform on which a specimen is to be placed and a heater, and wherein said rod and said pressure spring serve as a power supply line for said heater.

8. An electron microscope specimen holder comprising means for coupling a specimen to a specimen holder, said coupling means including a high temperature part and a lower temperature part, and wherein said high temperature part is fashioned of a heat insulating material and said low temperature part is fashioned of a low thermal expansion material.

9. An electron microscope specimen holder comprising a specimen support disposed within an outer frame, wherein means are provided for heating the specimen holder in use, and wherein a steep temperature gradient is provided between said specimen support and said frame when the specimen holder is in use.

10. An electron microscope specimen holder including means enabling a changing of a position of a specimen with respect to an electron microscope, and wherein an amount of change of said specimen position is in a range of 0.02~0.10 nm/sec.

11. An electron microscope wherein the electron microscope specimen holder according to claim 10 is mounted in said electron microscope.

12. An electron microscope specimen holder for observing a state of a specimen placed on a specimen support by applying an electron beam to said specimen, said specimen holder comprising:
a heater disposed at a lower part of said specimen support for heating the specimen on said specimen support to a predetermined temperature;
a rod for controlling an angle of said specimen support; and
a pressure spring for supporting said specimen support,
wherein said rod has a shape that makes a contact surface between said rod and said specimen support vertically stationary, and power is supplied to said heater through said rod and said pressure spring.

13. A transmission electron microscope comprising:
an electron gun for producing an electron beam;
an optical system for applying a predetermined amount of said electron beam over a predetermined area;
a specimen holder on which a specimen is to be placed so as to be observed as being applied with said electron beam; and
another optical system and a control system for observing a state of the specimen on said specimen holder,
wherein said specimen holder includes a structure whereby a specimen support is disposed within an outer fame, a thermal conductivity of a material of said specimen support is greater than a thermal conductivity of material of said frame, and said specimen support is provided at a lower part thereof with a heater to which power is supplied through a pressure spring serving to hold said specimen support and through a rod serving to adjust a tilting of said specimen support.

14. An electron microscope heating specimen holder comprising a specimen holder and a connection rod, wherein a thermal conductivity of material of said connection rod is less than a thermal conductivity of material of said specimen holder.

15. An electron microscope specimen holder according to claim 14, wherein the thermal conductivity of said connection rod is in the range of 15~20 W/mK.

16. An electron microscope wherein the electron microscope specimen holder according to claim 14 is mounted in said electron microscope.

17. An electron microscope specimen holder comprising a specimen holder for supporting a specimen and a connecting rod for finely controlling a position of said specimen, wherein said specimen holder is fashioned of phosphor bronze and said connecting rod is made of SUS304.

18. An electron microscope specimen holder in which a heater for heating a specimen is disposed at a lower part of a specimen support serving to support said specimen, wherein said heater is a plate heater made by forming a film of high resistance metal on a plate-like insulating member by means of vapor deposition or sintering.

19. An electron microscope specimen holder having a heater formed on an insulating member and serving to heat a specimen, wherein said heater is a plate heater made by filling a groove formed in a plate-like insulating member with high resistance metal or by sandwiching high resistance metal between plate-like insulating members.

* * * * *